United States Patent [19]

Saito

[11] Patent Number: 5,433,785

[45] Date of Patent: Jul. 18, 1995

[54] THERMAL TREATMENT APPARATUS, SEMICONDUCTOR DEVICE FABRICATION APPARATUS, LOAD-LOCK CHAMBER

[75] Inventor: Masaki Saito, Kanagawa, Japan

[73] Assignee: Sony Corporation, Tokyo, Japan

[21] Appl. No.: 135,966

[22] Filed: Oct. 14, 1993

[30] Foreign Application Priority Data

Oct. 14, 1992 [JP] Japan ................... 4-300630

[51] Int. Cl.$^6$ ................... C23C 16/00
[52] U.S. Cl. ................... 118/719; 204/298.25
[58] Field of Search ............... 118/719, 733; 204/298.25, 298.26; 156/345

[56] References Cited

U.S. PATENT DOCUMENTS

| | | | |
|---|---|---|---|
| 4,969,415 | 11/1990 | Bartha | 118/723 |
| 5,121,705 | 6/1992 | Sugino | 118/719 |
| 5,186,592 | 2/1993 | Toshima | 414/217 |
| 5,217,501 | 6/1993 | Fuse | 29/25.01 |
| 5,234,528 | 8/1993 | Nishi | 156/345 |
| 5,259,881 | 11/1993 | Edwards | 118/719 |
| 5,294,572 | 3/1994 | Granneman | 437/225 |
| 5,336,325 | 8/1994 | Devilbiss | 118/719 |

OTHER PUBLICATIONS

S. Wolf and RN tauber, "Silicon Processing for the VLSI Era", vol. 1—Process Technology, Lattice Press, 1986, pp. 567–568.

Primary Examiner—Robert Kunemund
Assistant Examiner—Joni Y. Chang
Attorney, Agent, or Firm—Hill, Steadman & Simpson

[57] ABSTRACT

A semiconductor device fabrication apparatus includes a thermal treatment device for thermally processing a semiconductor substrate, a first oxygen monitor for monitoring the density of oxygen in said thermal treatment device, a load-lock chamber separably coupled to said thermal treatment device for housing the semiconductor substrate before thermal treatment thereof by said thermal treatment device, and a second oxygen monitor for monitoring the density of oxygen in said load-lock chamber. First, the semiconductor substrate is introduced into the load-lock chamber, and then the load-lock chamber is evacuated. Thereafter, the density of oxygen in the load-lock chamber is measured by the second oxygen monitor, and the thermal treatment device is evacuated, after which the density of oxygen in the thermal treatment device is measured by the first oxygen monitor. The semiconductor substrate is introduced from the load-lock chamber into the thermal treatment device after the densities of oxygen in the load-lock chamber and the thermal treatment device as measured by the first and second oxygen monitors, respectively, have dropped below a predetermined level. A thin film is deposited on the semiconductor substrate in the thermal treatment device.

4 Claims, 1 Drawing Sheet

THERMAL TREATMENT APPARATUS, SEMICONDUCTOR DEVICE FABRICATION APPARATUS, LOAD-LOCK CHAMBER

BACKGROUND OF THE INVENTION

1. Field of the Invention

The present invention relates to a thermal treatment apparatus, a semiconductor device fabrication apparatus, a load-lock chamber of such a semiconductor device fabrication apparatus, and a method of fabricating a semiconductor device using such a thermal treatment apparatus or such a semiconductor device fabrication apparatus.

2. Description of the Prior Art

Recently, it has been of an important task in semiconductor fabrication technology to suppress the formation of a native oxide film. If a native oxide film is formed on a semiconductor substrate, then the leakage current of a semiconductor device that is fabricated is increased, the dielectric strength thereof is lowered, and the operating speed thereof is adversely affected.

Various efforts have been made to suppress the formation of a native oxide film. For example, there has been developed a load-lock semiconductor device fabrication apparatus for suppressing the formation of a native oxide film which would otherwise be deposited on the surface of a semiconductor substrate by oxygen trapped in a reaction chamber in a vertical low-pressure chemical vapor deposition (LPCVD) system. The load-lock semiconductor device fabrication apparatus has a load-lock chamber disposed between the reaction chamber and the exterior space for holding the inlet of the reaction chamber out of contact with the atmosphere. After the load-lock chamber is evacuated, an $N_2$ atmosphere is introduced into the load-lock chamber. Quantitative data have been acquired which indicate the relationship between the densities of oxygen in the load-lock chamber and the reaction chamber and the thickness of a native oxide film. The effectiveness of the load-lock chamber is being widely recognized in the art.

In CVD systems, it is known that a trace amount of oxygen leaks from the exterior into a semiconductor device fabrication apparatus, e.g., from the exterior through an O-ring of a reaction chamber of quartz into the reaction chamber. The oxygen leakage causes a native oxide film to be formed on a semiconductor substrate, and also degrades the characteristics of a thin film deposited on the semiconductor substrate. Examples of degraded characteristics include many grain boundaries in a crystalline thin film and wrong crystalline directions.

It is important that semiconductor device fabrication apparatus be provided with load-lock chambers for mass-producing semiconductor devices fabricate semiconductor devices of stable and reproducible characteristics. However, there have not been proposed any significant means and systems for ensuring suring oxygen densities in load-lock and reaction chambers for stable and reproducible semiconductor device characteristics. Furthermore, no measures are presently taken to prevent a trace amount of oxygen from leaking into semiconductor device fabrication apparatus.

It is known to monitor a moisture in sputtering apparatus. Japanese laid-open patent publication No. 3-152924, for example, discloses a monitoring process for photo-excited vapor phase processing. However, it has not been known to monitor the density of oxygen in semiconductor device fabrication apparatus or the like.

SUMMARY OF THE INVENTION

It is therefore an object of the present invention to provide a thermal treatment device capable of eliminating adverse effects which would otherwise be caused by residual oxygen.

Another object of the present invention is to provide a semiconductor device fabrication apparatus and a load-lock chamber which prevent a native oxide film from being formed on a semiconductor substrate thereby to fabricate a semiconductor device whose characteristics are not degraded by oxygen.

Still another object of the present invention is to provide a method of fabricating a semiconductor device using such a thermal treatment device or such a semiconductor device fabrication apparatus.

According to an aspect of the present invention, there is provided an apparatus for thermally treating a semiconductor conductor substrate, comprising a thermal treatment device for thermally processing a semiconductor substrate, and an oxygen monitor for monitoring the density of oxygen in the thermal treatment device.

According to another aspect of the present invention, there is provided a load-lock assembly for holding a semiconductor substrate before thermal treatment thereof, comprising a load-lock chamber for housing a semiconductor substrate therein, and an oxygen monitor for monitoring the density of oxygen in the load-lock chamber.

According to still another aspect of the present invention, there is provided an apparatus for fabricating a semiconductor device, comprising a thermal treatment device for thermally processing a semiconductor substrate, a first oxygen monitor for monitoring the density of oxygen in the thermal treatment device, a load-lock chamber separably coupled to the thermal treatment device for housing the semiconductor substrate before thermal treatment thereof by the thermal treatment device, and a second oxygen monitor for monitoring the density of oxygen in the load-lock chamber.

The thermal treatment device may comprise a chemical vapor deposition device.

Each of the oxygen monitors may comprise a mass spectrum analyzer.

According to yet another aspect of the present invention, there is provided a method of depositing a thin film on a semiconductor substrate with a semiconductor device fabrication apparatus having a thermal treatment device associated with an oxygen monitor, the method comprising the steps of evacuating the thermal treatment device, thereafter, measuring the density of oxygen in the thermal treatment device with the oxygen monitor, introducing a semiconductor substrate into the thermal treatment device after the density of oxygen in the thermal treatment device as measured by the oxygen monitor has dropped below a predetermined level, and depositing a thin film on the semiconductor substrate in the thermal treatment device.

According to yet still another aspect of the present invention, there is provided a method of depositing a thin film on a semiconductor substrate with a semiconductor device fabrication apparatus having a thermal treatment device associated with a first oxygen monitor, and a load-lock chamber associated with a second oxygen monitor, the load-lock chamber separably communicating with the thermal treatment device, the method comprising the steps of introducing a semiconductor substrate into the load-lock chamber, then, evacuating the load-lock chamber, thereafter, measuring the density of oxygen in the load-lock chamber with the second oxygen monitor, evacuating the thermal treatment device, thereafter, measuring the density of oxygen in the thermal treatment device with the first oxygen monitor, introducing the semiconductor substrate from the load-lock chamber into the thermal treatment device after the densities of oxygen in the load-lock chamber and the thermal treatment device as measured by the first and second oxygen monitors, respectively, have dropped below a predetermined level, and depositing a thin film on the semiconductor substrate in the thermal treatment device.

Since the thermal treatment device and/or the load-lock chamber is associated with the oxygen monitor, the oxygen density in the thermal treatment device and/or the load-lock chamber can be monitored accurately at all times. If the monitored oxygen density in the thermal treatment device and/or the load-lock chamber is higher than the predetermined level, then the process of fabricating semiconductor devices can immediately be interrupted.

The above and other objects, features, and advantages of the present invention will become apparent from the following description when taken in conjunction with the accompanying drawings which illustrate preferred embodiments of the present invention by way of example.

DETAILED DESCRIPTION OF THE PREFERRED EMBODIMENTS

Figure 1:
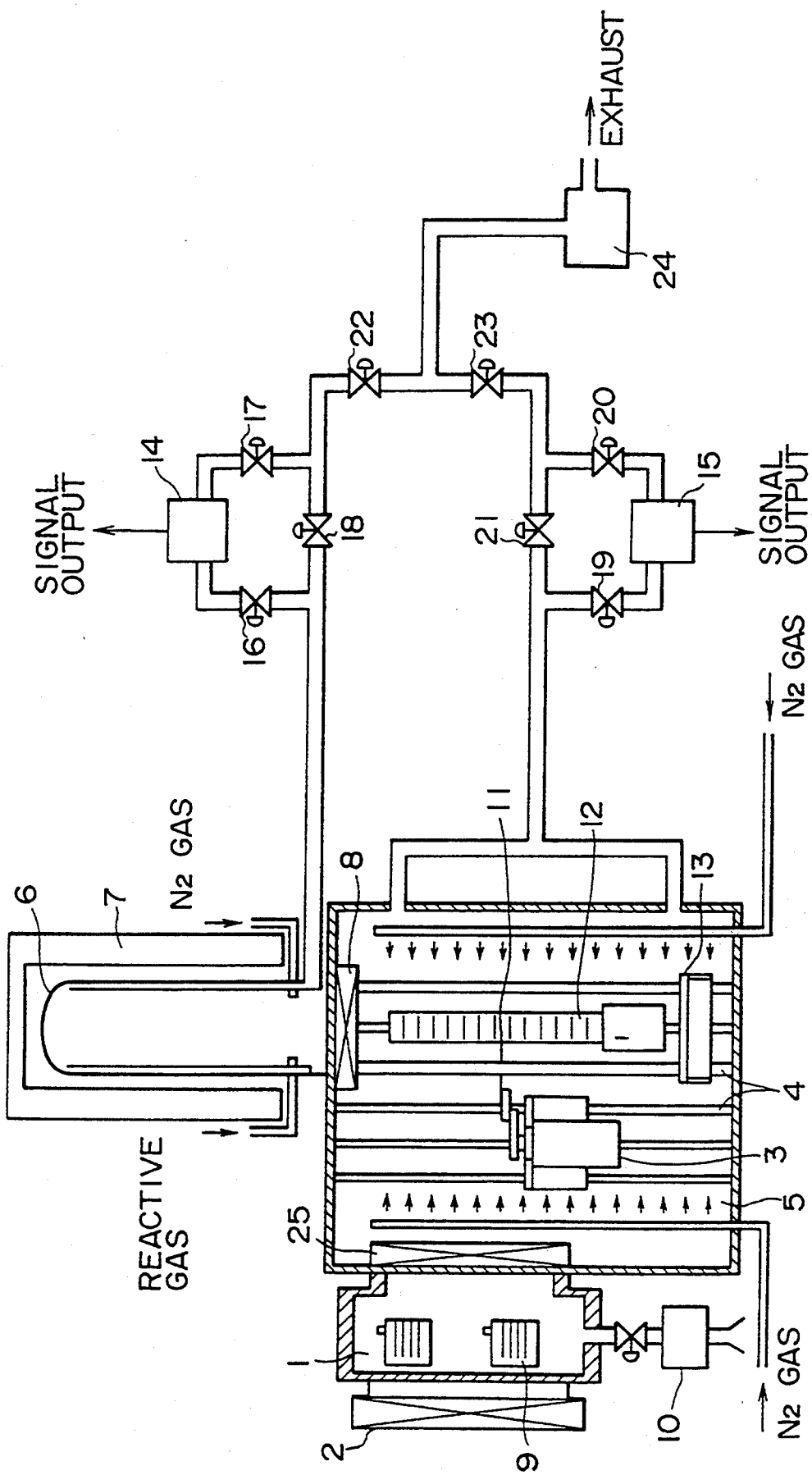
FIG. 1 is a vertical cross-sectional view of a semiconductor device fabrication apparatus according to the present invention which is composed of a vertical LPCVD device (thermal treatment device) and a load-lock chamber.

As shown in FIG. 1, a semiconductor device fabrication apparatus according to the present invention comprises a thermal treatment device in the form of a vertical LPCVD device and a load-lock chamber, and also has mass spectrum analyzers as oxygen density monitors.

The vertical LPCVD device comprises a vertical reaction chamber 6 surrounded by a heater 7 for heating the reaction chamber 6. A gas supply system for supplying an $N_2$ gas and a reactive gas is connected to the reaction chamber 6.

The load-lock chamber, denoted at 5, houses a transfer unit 3 and a wafer boat 12 that are vertically movable by an elevator 4. The wafer boat 12 serves to carry semiconductor wafers. A furnace inlet cap 13 is attached to a lower portion of the wafer boat 12. The load-lock chamber 5 can be filled with an $N_2$ gas introduced through $N_2$ gas pipes extending into the load-lock chamber 5. The reaction chamber 6 and the load-lock chamber 5 can communicate with each other through a gate valve 8 positioned above the wafer boat 12.

A cassette chamber 1 for housing wafer cassettes 9 is disposed outside of the load-lock chamber 5, and can communicate with the load-lock chamber 5 through a gate valve 25 positioned laterally of the transfer unit 3. Each of the wafer cassettes 9 serves to hold semiconductor wafers. The cassette chamber 1 can be evacuated by a cassette chamber pump 10 connected thereto. A gate valve 2 is mounted on an outer side of the cassette chamber 1.

The reaction chamber 6 can be evacuated by a pump 24 through an exhaust pipe having valves 18, 22. The load-lock chamber 5 can also be evacuated by the pump 24 through an exhaust pipe having valves 21, 23.

According to the present invention, a bypass pipe is connected to the exhaust pipe extending from the reaction chamber 6 in bypassing relationship to the valve 18. An oxygen monitor 14 in the form of a mass spectrum analyzer for monitoring the density of oxygen in the reaction chamber 6 is attached to the bypass pipe. Another bypass pipe is connected to the exhaust pipe extending from the load-load chamber 5 in bypassing relationship to the valve 21. An oxygen monitor 15 in the form of a mass spectrum analyzer for monitoring the density of oxygen in the load-lock chamber 5 is attached to the bypass pipe. Detectors (not shown) are electrically connected to detect output signals produced by the respective oxygen monitors 14, 15.

A process of depositing a thin film on a semiconductor substrate with the semiconductor device fabrication apparatus of the above structure will be described below.

First, semiconductor substrates, i.e., semiconductor wafers, are introduced into the load-lock chamber 5, and then the load-lock chamber 5 is evacuated by the pump 24. Thereafter, the density of oxygen remaining in the load-lock chamber 5 is measured by the oxygen monitor 15.

More specifically, after the wafer cassettes 9 carrying semiconductor wafers 11 have been introduced into the cassette chamber 1, the cassette chamber 1 is evacuated by the cassette chamber pump 10 to prevent ambient air from entering the load-lock chamber 5. At this time, the load-lock chamber 5 has been evacuated by the pump 24 to the same vacuum as the cassette chamber 1. Then, the gate valve 25 is opened, and the wafers 11 are transferred from the wafer cassettes 9 to the wafer boat 12 in the load-lock chamber 5 by the transfer unit 3. After the wafers 11 are transferred, the gate valve 25 is closed.

Thereafter, while introducing an $N_2$ gas into the load-lock chamber 5, the load-lock chamber 5 is evacuated by the pump 24 through the valves 21, 23 until the load-lock chamber 5 is filled with the $N_2$ gas. After elapse of a certain period of time, the valve 21 is closed, and the valves 19, 20 are opened to allow the oxygen monitor 15 to monitor the atmosphere in the load-lock chamber 5.

Concurrent with the above operation, the thermal treatment device is evacuated, and then the density of oxygen remaining in the thermal treatment device is monitored by the oxygen monitor 14.

More specifically, with the gate valve 8 closed, an $N_2$ gas is introduced into the reaction chamber 6, and the reaction chamber 6 is simultaneously evacuated by the pump 24 through the valves 18, 22. After elapse of a certain period of time, the valve 18 is closed, and the valves 16, 17 are opened to allow the oxygen monitor 14 to monitor the atmosphere in the reaction chamber 6.

After the oxygen densities in the load-lock chamber 5 and the thermal treatment device, i.e., the reaction chamber 6, have been reduced below a predetermined level, the wafers 11 are carried from the load-lock chamber 5 into the reaction chamber 6 for depositing thin films on the wafers 11.

More specifically, if an oxygen density in excess of the predetermined level is detected in the load-lock chamber 5, then the operation of the LPCVD device is interrupted, and the wafers 11 are returned from the wafer boat 12 to the wafer cassettes 9 by the transfer unit 3.

Similarly, if an oxygen density in excess of the predetermined level is detected in the reaction chamber 6, then the operation of the LPCVD device is also interrupted, and the wafers 11 are returned from the wafer boat 12 to the wafer cassettes 9 by the transfer unit 3.

On the other hand, if the oxygen densities in the load-lock chamber 5 and the reaction chamber 6 are found normal by the oxygen monitors 15, 14, i.e., after the oxygen densities in the load-lock chamber 5 and the thermal treatment device have dropped below the predetermined level, the gate valve 8 is opened, and the wafers 11 on the wafer boat 12 are introduced into the reaction chamber 6 by the elevator 4. Thereafter, a usual film growth sequence of the LPCVD device is started to deposit thin films on the wafers 11 by way of CVD. During the film growth, the inlet of the reaction chamber 6 is closed by the furnace inlet cap 13.

The vertical reaction chamber 6 of the LPCVD device may be replaced with a horizontal reaction chamber of a single-wafer reaction chamber. The thermal treatment device may be a thermal diffusion device including an annealing furnace or a sputtering device, rather than the CVD device. Preferably, these devices should be arranged in the same manner as shown in FIG. 1.

In the fabrication of semiconductor devices, not all the operation of the various illustrated components may be carried out. For example, the valves 16, 17, 19, 20 may be manual valves, and the oxygen monitors 14, 15 may be detachable, with the oxygen densities in the load-lock chamber 5 and the reaction chamber 6 being periodically monitored.

The oxygen monitor 15 in the form of a mass spectrum analyzer may be replaced with an oxygen density detector which is located in the load-lock chamber 4 for monitoring the oxygen density therein at all times.

Oxygen may exist in the form of $O_2$, $NO_x$, $CO_x$, or $H_2O$. Therefore, each of the oxygen monitors 14, 15 may be of any type insofar as it can detect oxygen in any of such forms. For example, each of the oxygen monitors 14, 15 may comprise a mass spectrum analyzer, an oxygen density detector of the galvanic cell type, the constant-potential electrolytic type, or the diaphragm electrode type, a solid electrolytic gas sensor, a semiconductor gas sensor, or any of various humidity sensors. However, the mass spectrum analyzer is preferable to the other oxygen monitors.

With the present invention, the oxygen density in the thermal treatment device and/or the load-lock chamber 5 is monitored by the oxygen monitor. If the monitored oxygen density is in excess of a predetermined level, then it is possible to prevent semiconductor substrates or wafers from being introduced into the thermal treatment device. As a result, defective semiconductor devices are prevented from being produced by the thermal treatment device. The thermal treatment device with the load-lock chamber, i.e., a CVD device, can therefore be used to mass-produce semiconductor devices of stable characteristics.

Although certain preferred embodiments of the present invention has been shown and described in detail, it should be understood that various changes and modifications may be made therein without departing from the scope of the appended claims.

What is claimed is:

1. An apparatus for thermally treating a semiconductor substrates comprising, a cassette chamber into which said semiconductor substrate can be placed, a load-lock chamber in communication with said cassette chamber by a first gate valve, first transfer means for moving semiconductor substrates from said cassette chamber into said load-lock chamber, a reaction chamber in communication with said load-lock chamber by a second gate valve, an exhaust pump in communication with said load-lock chamber, means for supplying nitrogen gas to said load-lock chamber, first means for measuring oxygen in said load-lock chamber, and second means for measuring oxygen in to said reaction chamber.

2. An apparatus for thermally treating and monitoring semiconductor substrate according to claim 1 wherein said exhaust pump is connected to said load-lock chamber by a first conduit and said first means for measuring oxygen connected to said first conduit.

3. An apparatus according to claim 1, wherein said thermal treatment device comprises a chemical vapor deposition device.

4. An apparatus according to claim 1, wherein said oxygen monitor comprises a mass spectrum analyzer.

* * * * *